(12) United States Patent
Huang et al.

(10) Patent No.: US 6,852,589 B2
(45) Date of Patent: Feb. 8, 2005

(54) METHOD TO MODIFY 0.25 μM 1T-RAM BY EXTRA RESIST PROTECT OXIDE (RPO) BLOCKING

(75) Inventors: Ching-Kwun Huang, Yongho (TW); Chih-Chang Chen, Hsin-Chu (TW); Hsien-Chih Peng, Hsin-Chu (TW); Pin-Shyne Chin, Hsin-Chu (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 0 days.

(21) Appl. No.: 10/323,098

(22) Filed: Dec. 18, 2002

(65) Prior Publication Data

US 2003/0148576 A1 Aug. 7, 2003

Related U.S. Application Data

(63) Continuation of application No. 09/808,924, filed on Mar. 16, 2001, now Pat. No. 6,528,422.

(51) Int. Cl.$^7$ .......................................... H01L 21/8242
(52) U.S. Cl. ..................... 438/241; 438/655; 438/669
(58) Field of Search ............................... 438/241, 655, 438/656, 669, 683, 684

(56) References Cited

U.S. PATENT DOCUMENTS

| | | | |
|---|---|---|---|
| 5,434,438 A | 7/1995 | Kuo | 257/300 |
| 5,863,820 A | 1/1999 | Huang | 438/241 |
| 5,918,148 A | 6/1999 | Sato | 438/669 |
| 5,998,252 A * | 12/1999 | Huang | 438/241 |
| 6,004,843 A * | 12/1999 | Huang | 438/241 |
| 6,015,730 A | 1/2000 | Wang et al. | 438/241 |
| 6,048,738 A | 4/2000 | Hsu et al. | 438/3 |
| 6,074,915 A * | 6/2000 | Chen et al. | 438/258 |
| 6,091,106 A | 7/2000 | Park | 257/330 |
| 6,093,593 A * | 7/2000 | Jang | 438/221 |
| 6,096,595 A * | 8/2000 | Huang | 438/238 |
| 6,187,655 B1 * | 2/2001 | Wang et al. | 438/528 |
| 6,194,258 B1 * | 2/2001 | Wuu | 438/200 |
| 6,319,784 B1 * | 11/2001 | Yu et al. | 438/301 |
| 6,348,389 B1 * | 2/2002 | Chou et al. | 438/305 |
| 6,350,636 B1 * | 2/2002 | Lee et al. | 438/186 |
| 6,468,904 B1 * | 10/2002 | Chen et al. | 438/682 |
| 6,528,422 B1 * | 3/2003 | Huang et al. | 438/683 |
| 6,569,784 B1 * | 5/2003 | Wang et al. | 438/787 |

* cited by examiner

*Primary Examiner*—George Fourson
*Assistant Examiner*—Fernando L. Toledo

(57) ABSTRACT

A method to fabricate a 1T-RAM device, comprising the following steps. A semiconductor substrate having an access transistor area and an exposed bottom plate within a capacitor area proximate the access transistor area is provided. A gate with an underlying gate dielectric layer within the access transistor area are formed. The gate and underlying gate dielectric layer having sidewall spacers formed over their respective exposed side walls. A top plate with an underlying capacitor layer over the bottom plate within the capacitor area are formed. The top plate and underlying capacitor layer having sidewall spacers formed over their respective exposed side walls. A patterned resist protect oxide (RPO) layer is formed over at least the drain of the structure not to be silicided. Metal silicide portions are formed over the structure not protected by the RPO layer.

40 Claims, 3 Drawing Sheets

METHOD TO MODIFY 0.25 μM 1T-RAM BY EXTRA RESIST PROTECT OXIDE (RPO) BLOCKING

This is a continuation of patent application Ser. No. 09/808,924, filing date Mar. 16, 2001 now U.S. Pat. No. 6,528,422, Method To Modify 0.25 μm 1T-Ram By Extra Resist Protect Oxide (RPO) Blocking, assigned to the same assignee as the present invention.

FIELD OF THE INVENTION

The present invention relates generally to semiconductor memory devices and more specifically to methods to improve 1T-RAM 0.25 μm logic-based DRAM.

BACKGROUND OF THE INVENTION

1T-RAM is a 0.25 μm logic-based DRAM that easily fails due to high junction leakage current created by the logic process. In the current process, resist protect oxide (RPO) is used where it is desired that silicidation not take place, for example ESD device or non-silicide resistor.

U.S. Pat. No. 6,015,730 to Wang et al. and U.S. Pat. No. 5,863,820 to Huang each describe salicide processes with an resist protect oxide (RPO) protective step.

U.S. Pat. No. 6,048,738 to Hsu et al. describes a process for fabricating a 1T ferroelectric random access memory (FRAM) for a VLSI RAM array.

U.S. Pat. No. 6,091,106 to Park describes an SRAM process forming a transistor structure having a grooved gate.

U.S. Pat. No. 5,918,148 to Sato describes a 1T SRAM process wherein the reduction in product quality and yield due to the partial reduction in restoring level, a lag of timing, can be avoided.

U.S. Pat. No. 5,434,438 to Kuo describes a 1T and one capacitor memory device

SUMMARY OF THE INVENTION

Accordingly, it is an object of the present invention to provide an RPO method to reduce junction leakage of 1T-RAM logic base DRAM.

Other objects will appear hereinafter.

It has now been discovered that the above and other objects of the present invention may be accomplished in the following manner. Specifically, a semiconductor substrate having an access transistor area and an exposed bottom plate within a capacitor area proximate the access transistor area is provided. A gate with an underlying gate dielectric layer within the access transistor area are formed. The gate and underlying gate dielectric layer having sidewall spacers formed over their respective exposed side walls. A top plate with an underlying capacitor layer over the bottom plate within the capacitor area are formed. The top plate and underlying capacitor layer having sidewall spacers formed over their respective exposed side walls. A patterned resist protect oxide (RPO) layer is formed over at least the drain of the structure not to be silicided. Metal silicide portions are formed over the structure not protected by the RPO layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Based upon failure mode and current analysis data, the inventors believe leakage is the root cause of SRAM failure (random single bit (RSB) SRAM failure mode). Two likely leakage paths are suggested:

(1) junction leakage—salicide formation problem is suspected; by WAT mapping of edge worse with salicide formation; DRAM cell leaky junction using logic process is suspected; and (2) leakage near STI—although this theory must be verified.

The inventors have discovered that by creating an extra resist protect oxide (RPO) block to prevent salicide formation at selected locations, leakage caused by salicide is thus suppressed.

Unless otherwise specified, all structures, layers, steps, methods, etc. may be formed or accomplished by conventional steps or methods known in the prior art.

Figure 1:
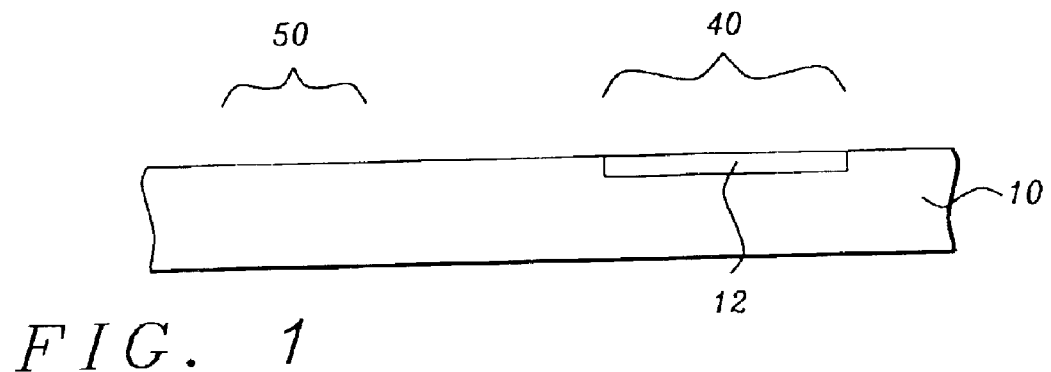
FIGS. 1 to 7 illustrate a preferred embodiment of the present invention.

As shown in FIG. 1, semiconductor substrate 10 includes an access transistor area 50, and a capacitor area 40 within which is bottom plate 12 for a capacitor. Semiconductor substrate 10 is preferably comprised of silicon. Bottom plate 12 is preferably comprised of silicon. Actually, no special layer formation is necessary for layer 12. It should only work by general device operation. That is, an inversion layer is formed when $V_g > V_T$ is applied.

Figure 2:
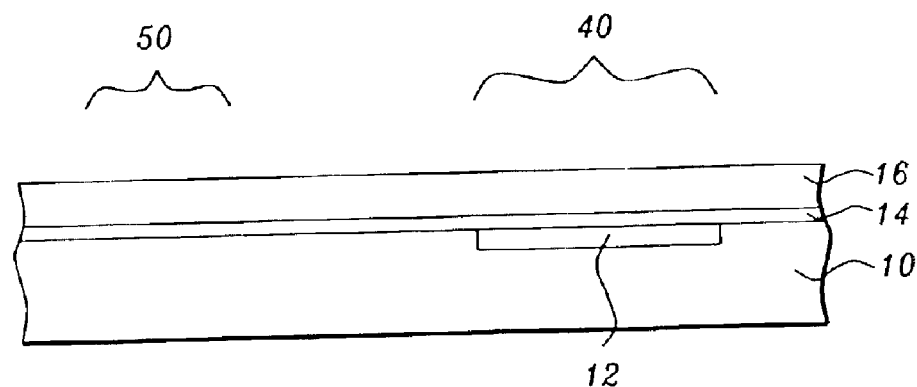

As shown in FIG. 2, dielectric layer 14 is formed over semiconductor substrate 10 and bottom plate 12 to a thickness of preferably from about 10 to 70 Å and more preferably from about 15 to 65 Å. Dielectric layer 14 is preferably comprised of silicon nitride or gate oxide and is preferably comprised of gate oxide.

Conductive layer 16 is then formed over dielectric layer 14 to a thickness of preferably from about 1000 to 3000 Å and more preferably from about 1200 to 2800 Å. Conductive layer 16 is preferably comprised of polysilicon.

Figure 3:
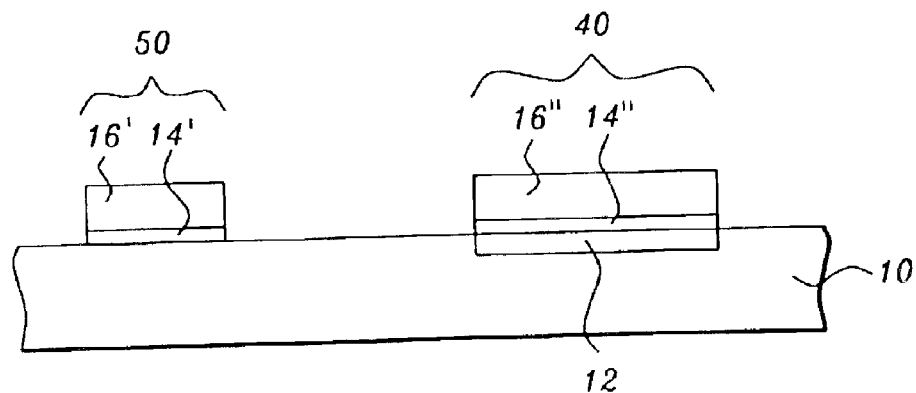

As shown in FIG. 3, conductive layer 16 and dielectric layer 14 are patterned to form, for example: gate 16' over gate dielectric layer 14' of an access transistor within access transistor area 50; and top plate 16" over capacitor layer 14" (which is in turn over bottom plate 12) of a capacitor within capacitor area 40.

Figure 4:
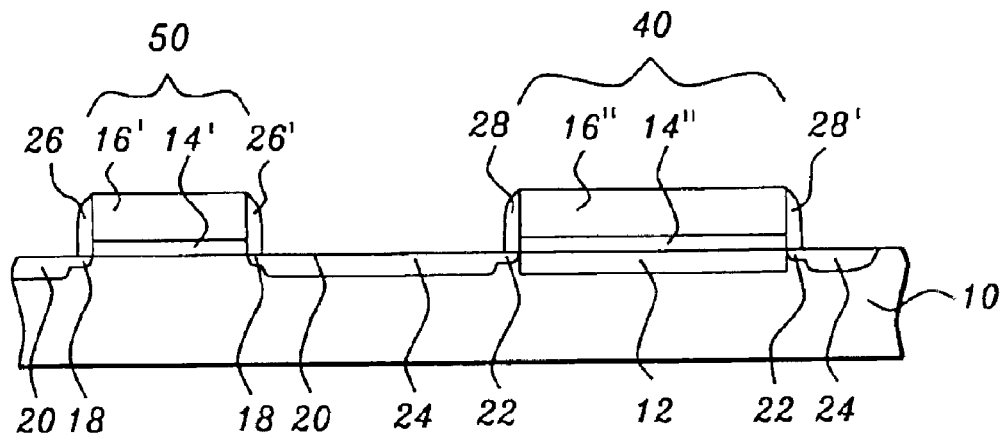

As shown in FIG. 4, access transistor LDD implants 18 are formed within semiconductor substrate 10 adjacent gate 16'/gate dielectric layer 14' and capacitor LDD implants 22 are formed within semiconductor substrate 10 adjacent top plate 16"/capacitor layer 14"/bottom plate 12. LDD implants 18 and LDD implants 22 are the same LDD implant.

Access transistor sidewall spacers 26, 26' are formed upon the exposed side walls of gate 16'/gate dielectric layer 14', and capacitor sidewall spacers 28, 28' are formed upon the exposed side walls of top plate 16"/capacitor layer 14". Access transistor sidewall spacers 26, 26' and capacitor sidewall spacers 28, 28' are preferably from about 500 to 2000 Å wide and are more preferably from about 550 to 1950 Å wide.

Access transistor high density implants 20 are formed within semiconductor substrate 10 adjacent gate adjacent access transistor LDD implants 18 and high density implants 24 are formed within semiconductor substrate 10 adjacent capacitor LDD implants 22. High density implants 20 and high density implants 24 are the same source/drain implant.

Formation of RPO Protective Portion 32

Figure 5:
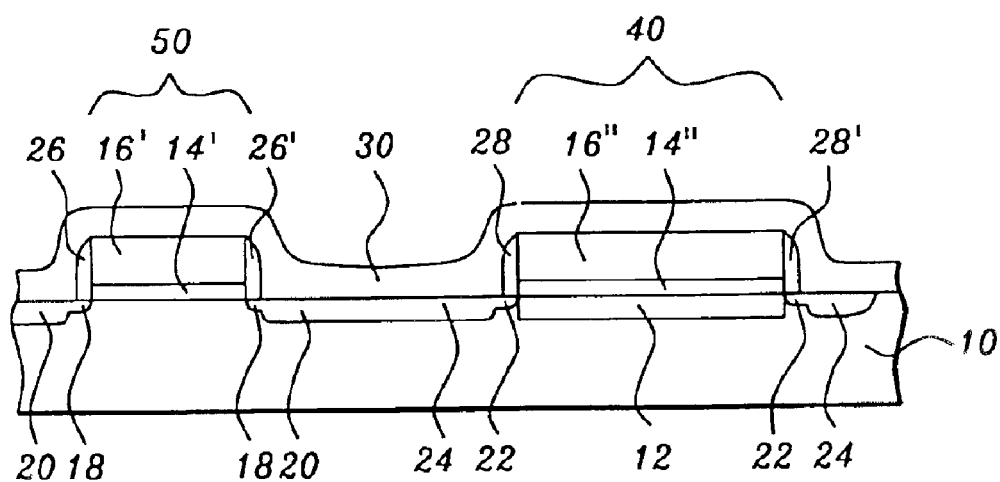

As shown in FIG. 5, RPO layer 30 is formed over the structure of FIG. 4 to a thickness of preferably from about 100 to 500 Å and more preferably from about 150 to 450 Å.

Figure 6:
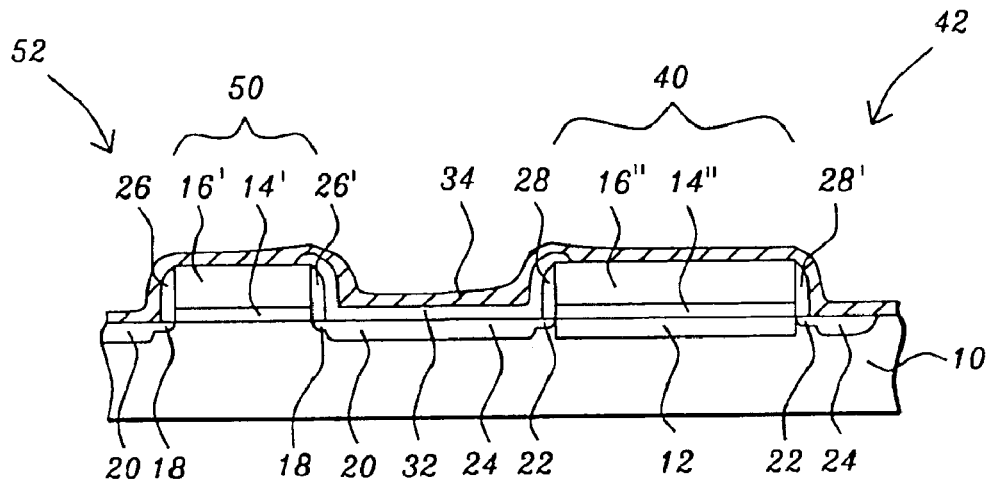

In a key step of the invention, and as shown in FIG. 6, RPO layer 30 is patterned to leave RPO protective portion 32 over semiconductor substrate 10 over at least the drain, i.e. between access transistor 52 and capacitor 42 and generally over the respective facing sidewall spacers (in this example access transistor sidewall spacer 26' and capacitor sidewall spacer 28). RPO protective portion 32 has a thickness of preferably from about 100 to 500 Å and more preferably from about 150 to 450 Å.

It is understood that RPO protective portion 32 may be also formed in another location which is to be protected from a silicide formation reaction between metal layer 34 and underlying contacted silicon/polysilicon during a subsequent rapid thermal anneal (RTA), for example. The key of the invention is to add RPO layout on MoSys 1T-SRAM, where there is no RPO blocking on original/prior art MoSys 1T-SRAM IP. RPO protective portion may be formed anywhere the design calls for, but here in 1T-SRAM it provides a leakage prevention and makes the 1T-SRAM properly work. RPO may be formed at other locations, but the key is to add RPO blocking at portion "32" inside the 1T-SRAM as shown in FIG. 6.

Formation of Metal Silicide Portions 36, 38, 41, 48

As shown in FIG. 6, metal layer 34 is formed over the structure and over RPO protective portion 32 to a thickness of preferably from about 100 to 800 Å and more preferably from about 150 to 750 Å. Metal layer is preferably comprised of nickel (Ni), cobalt (Co) or titanium (Ti) and is more preferably comprised of titanium.

Figure 7:
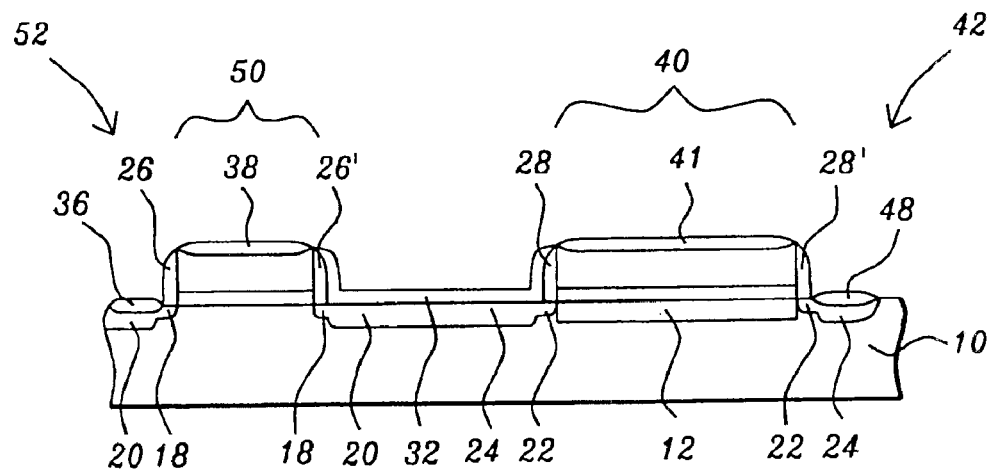

As shown in FIG. 7, a first rapid thermal anneal (RTA) process is then performed to form metal silicide portions 36, 38, 41, 42 over silicon/polysilicon other than where RPO protective portion 32 separates metal layer 34 from otherwise exposed silicon/polysilicon. Where metal layer 34 is titanium, the metal silicide portions 36, 38, 41, 42 are comprised of $TiSi_x$.

A selective etch of $TiSi_x$ is then performed leaving $TiSi_x$ portions 36, 38, 41, 48, the unreacted Ti is removed from, inter alia, over RPO portion 32 and a second RTA is performed to complete formation of access transistor 52 and capacitor 42 of a 1T-RAM logic base DRAM.

In tests conducted by the inventors, it was found that by using the method of the present invention wafer yields were increased from about 10% to up to about 86%. It is noted that different products may vary as to the wafer yield increase.

Advantages of the Present Invention

The advantages of the present invention include:

1) junction leakage is reduced in 1T-RAM logic base DRAM; and 2) yields are increased from about 10% to about 86%.

While particular embodiments of the present invention have been illustrated and described, it is not intended to limit the invention, except as defined by the following claims.

We claim:

1. A method to fabricate a 1T-RAM device, comprising the steps of:

providing a semiconductor substrate having an access transistor area and a bottom plate within a capacitor area proximate the access transistor area;

forming a gate within the access transistor area;

forming a top plate with an underlying capacitor dielectric layer over the bottom plate within the capacitor area; the top plate, the underlying capacitor dielectric layer and the bottom plate forming a capacitor;

forming a contact area between the gate and the top plate;

forming a patterned resist protect oxide (RPO) layer over at least a contact area but not over the gate of the access transistor area; and forming metal silicide portions over the gate and the top plate not protected by the RPO layer.

2. The method of claim 1, wherein the metal silicide portions are formed by:

forming a metal layer over the gate, the top plate and the patterned RPO layer; and subjecting the metal layer to a rapid thermal anneal (RTA).

3. The method of claim 1, wherein the metal silicide portions are formed by:

forming a metal layer over the gate, the top plate and the patterned RPO layer;

subjecting the metal layer to a first rapid thermal anneal (RTA);

removing a portion of the metal layer; and subjecting the remaining metal layer to a second rapid thermal anneal (RTA).

4. The method of claim 1, including the steps of:

forming access transistor LDD implants adjacent the gate and capacitor LDD implants adjacent the top plate or capacitor layer; and forming access transistor high density implants adjacent the access transistor LDD implants and capacitor high density implants adjacent the capacitor LDD implants.

5. The method of claim 1, wherein the gate and top plate each have a thickness of from about 1000 to 3000 Å; the capacitor dielectric layer has a thickness of from about 10 to 70 Å.

6. The method of claim 1, wherein the gate and top plate each have a thickness of from about 1200 to 2800 Å; the capacitor dielectric layer has a thickness of from about 15 to 65 Å.

7. The method of claim 1, wherein the patterned resist protect oxide (RPO) layer has a thickness of from about 100 to 500 Å; and the metal silicide portions have a thickness of from about 100 to 800 Å.

8. The method of claim 1, wherein the patterned resist protect oxide (RPO) layer has a thickness of from about 150 to 450 Å; and the metal silicide portions have a thickness of from about 150 to 750 Å.

9. The method of claim 1, wherein the patterned resist protect oxide (RPO) layer is formed at least over the semiconductor substrate between the access transistor area and the capacitor area; whereby metal silicide is not formed at least over the semiconductor substrate between the access transistor area and the capacitor area.

10. The method of claim 1, wherein the gate dielectric layer and the capacitor dielectric layer are each comprised of oxide; the gate and the top plate are each comprised of polysilicon; and the metal silicide portions are comprised of a metal silicide selected from the group consisting of $NiSi_x$, $CoSi_x$, and $TiSi_x$.

11. The method of claim 1, wherein the gate dielectric layer and the capacitor dielectric layer are each comprised of oxide; the gate and the top plate are each comprised of polysilicon; and the metal silicide portions are comprised of $TiSi_x$.

12. The method of claim 1, wherein: the gate is an access transistor gate; the top and bottom plates comprise a capacitor; and the access transistor area and capacitor area comprise the 1T-RAM device.

13. The method of claim 1, wherein the underlying capacitor dielectric layer is comprised of oxide.

14. The method of claim 1, wherein the top plate with an underlying gate dielectric layer is formed on the bottom plate within the capacitor area.

15. A method to fabricate a 1T-RAM device, comprising the steps of:
providing a semiconductor substrate having an access transistor area and an bottom plate within a capacitor area proximate the access transistor area;
forming a gate within the access transistor area;
forming a top plate with an underlying capacitor dielectric layer over the bottom plate within the capacitor area; the top plate and underlying capacitor dielectric layer; the top plate, the underlying capacitor dielectric layer and the bottom plate forming a capacitor;
forming a contact area between the gate and the top plate;
forming a patterned resist protect oxide (RPO) layer over at least a contact area but not over the gate of the gate of the access transistor area;
forming a metal layer over the gate, the top plate and the patterned RPO layer; and
rapid thermal annealing the metal layer to form metal silicide portions over the gate and the top plate not protected by the patterned RPO layer.

16. The method of claim 15, including the steps of:
forming access transistor LDD implants adjacent the gate and capacitor LDD implants adjacent the top plate or capacitor dielectric layer; and
forming access transistor high density implants adjacent the access transistor LDD implants and capacitor high density implants adjacent the capacitor LDD implants.

17. The method of claim 15, wherein the gate and top plate each have a thickness of from about 1000 to 3000 Å; the capacitor dielectric layer has a thickness of from about 10 to 70 Å.

18. The method of claim 15, wherein the gate and top plate each have a thickness of from about 1200 to 2800 Å; the capacitor dielectric layer has a thickness of from about 15 to 65 Å.

19. The method of claim 15, wherein the patterned resist protect oxide (RPO) layer has a thickness of from about 100 to 500 Å; and the metal silicide portions have a thickness of from about 100 to 800 Å.

20. The method of claim 15, wherein the patterned resist protect oxide (RPO) layer has a thickness of from about 150 to 450 Å; and the metal silicide portions have a thickness of from about 100 to 750 Å.

21. The method of claim 15, wherein the patterned resist protect oxide (RPO) layer is formed at least over the semiconductor substrate between the access transistor area and the capacitor area; whereby metal silicide is not formed at least over the semiconductor substrate between the access transistor area and the capacitor area.

22. The method of claim 15, wherein the gate dielectric layer and the capacitor dielectric layer are each comprised of gate oxide; the gate and the top plate are each comprised of polysilicon; and the metal silicide portions are comprised of a metal silicide selected from the group consisting of $CoSi_x$, $NiSi_x$ and $TiSi_x$.

23. The method of claim 15, wherein the gate dielectric layer and the capacitor dielectric layer are each comprised of oxide; the gate and the top plate are each comprised of polysilicon; and the metal silicide portions are comprised of $TiSi_x$.

24. The method of claim 15, wherein: the gate is an access transistor gate; the top and bottom plates comprise a capacitor; and the access transistor area and capacitor area comprise the 1T-RAM device.

25. The method of claim 15, wherein the underlying capacitor dielectric layer is comprised of oxide.

26. The method of claim 15, wherein the top plate with an underlying gate dielectric layer is formed on the bottom plate within the capacitor area.

27. A method to fabricate a 1T-RAM device, comprising the steps of:
providing a semiconductor substrate having an access transistor area and a bottom plate within a capacitor area proximate the access transistor area;
forming a gate within the access transistor area; the gate being comprised of polysilicon;
forming a top plate with an underlying capacitor dielectric layer over the bottom plate within the capacitor area; the top plate being comprised of polysilicon; the capacitor layer being comprised of gate oxide; the top plate, the underlying capacitor dielectric layer and the bottom plate forming a capacitor;
forming a contact area between the gate and the top plate;
forming a patterned resist protect oxide (RPO) layer over at least a contact area but not over the gate of the access transistor area; and
forming metal silicide portions over the gate and the top plate not protected by the patterned RPO layer.

28. The method of claim 27, wherein the metal silicide portions are formed by:
forming a metal layer over gate, the top plate and the patterned RPO layer; and
subjecting the metal layer to a rapid thermal anneal (RTA).

29. The method of claim 27, wherein the metal silicide portions are formed by:
forming a metal layer over the gate, the top plate and the patterned RPO layer;
subjecting the metal layer to a first rapid thermal anneal (RTA);
removing a portion of the metal layer; and
subjecting the remaining metal layer to a second rapid thermal anneal (RTA).

30. The method of claim 27, including the steps of:
forming access transistor LDD implants adjacent the gate and capacitor LDD implants adjacent the top plate or capacitor dielectric layer; and
forming access transistor high density implants adjacent the access transistor LDD implants and capacitor high density implants adjacent the capacitor LDD implants.

31. The method of claim 27, wherein the gate and top plate each have a thickness of from about 1000 to 3000 Å; the gate dielectric layer and the capacitor dielectric layer each have a thickness of from about 10 to 70 Å; the gate or gate dielectric layer sidewall spacers are from about 500 to 2000 Å wide; and the top plate or capacitor dielectric layer sidewall spacers are from about 500 to 2000 Å wide.

32. The method of claim 27, wherein the gate and top plate each have a thickness of from about 1200 to 2800 Å; the capacitor dielectric layer has a thickness of from about 15 to 65 Å.

33. The method of claim 27, wherein the patterned resist protect oxide (RPO) layer has a thickness of from about 100 to 500 Å; and the metal silicide portions have a thickness of from about 100 to 800 Å.

34. The method of claim 27, wherein the patterned resist protect oxide (RPO) layer has a thickness of from about 150 to 450 Å; and the metal silicide portions have a thickness of from about 150 to 750 Å.

35. The method of claim 27, wherein the patterned resist protect oxide (RPO) layer is formed at least over the semiconductor substrate between the access transistor area and the capacitor area; whereby metal silicide is not formed at least over the semiconductor substrate between the access transistor area and the capacitor area.

36. The method of claim 27, wherein the metal silicide portions are comprised of a metal silicide selected from the group consisting of $NiSi_x$ and $CoSi_x$ and $TiSi_x$.

37. The method of claim 27, wherein the metal silicide portions are comprised of $TiSi_x$.

38. The method of claim 27, wherein: the gate is an access transistor gate; the top and bottom plates comprise a capacitor; and the access transistor area and capacitor area comprise the 1T-RAM device.

39. The method of claim 27, wherein the underlying capacitor dielectric layer is comprised of oxide.

40. The method of claim 27, wherein the top plate with an underlying gate dielectric layer is formed on the bottom plate within the capacitor area.

* * * * *

UNITED STATES PATENT AND TRADEMARK OFFICE
CERTIFICATE OF CORRECTION

PATENT NO. : 6,852,589 B2  Page 1 of 1
DATED : February 8, 2005
INVENTOR(S) : Ching-Kwun Huang et al.

It is certified that error appears in the above-identified patent and that said Letters Patent is hereby corrected as shown below:

Column 4,
Line 29, insert -- dielectric -- between "capacitor" and "layer".

Column 5,
Lines 21-22, delete the second occurrence of the phrase, "the gate of".

Signed and Sealed this

Twenty-third Day of August, 2005

JON W. DUDAS
*Director of the United States Patent and Trademark Office*